(12) United States Patent
Waters et al.

(10) Patent No.: US 11,770,118 B2
(45) Date of Patent: Sep. 26, 2023

(54) LOW-POWER MODE FOR A USB TYPE-C POWER DELIVERY CONTROLLER

(71) Applicant: Texas Instruments Incorporated, Dallas, TX (US)

(72) Inventors: Deric Wayne Waters, Dallas, TX (US); Roy Alan Hastings, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/093,677

(22) Filed: Nov. 10, 2020

(65) Prior Publication Data

US 2021/0055783 A1 Feb. 25, 2021

Related U.S. Application Data

(63) Continuation of application No. 15/949,841, filed on Apr. 10, 2018, now Pat. No. 10,866,628.

(51) Int. Cl.
| | |
|---|---|
| *G06F 1/3296* | (2019.01) |
| *H03H 7/06* | (2006.01) |
| *G06F 1/28* | (2006.01) |
| *G06F 1/3206* | (2019.01) |
| *H02J 7/00* | (2006.01) |
| *H03K 5/24* | (2006.01) |

(52) U.S. Cl.
CPC ............. *H03K 5/24* (2013.01); *G06F 1/28* (2013.01); *G06F 1/3206* (2013.01); *G06F 1/3296* (2013.01); *H03H 7/06* (2013.01); *H02J 7/00* (2013.01); *H02J 7/00034* (2020.01)

(58) Field of Classification Search
CPC . H03K 5/24; H02J 1/00; G06F 1/3206; G06F 1/28; G06F 1/3296

USPC .......................................................... 307/116
See application file for complete search history.

(56) References Cited

U.S. PATENT DOCUMENTS

| | | | |
|---|---|---|---|
| 6,833,686 B2 | 12/2004 | Veselic | |
| 8,503,891 B2* | 8/2013 | Mashimo | ........... H04B 10/6932 398/209 |
| 9,998,276 B2* | 6/2018 | Kulkarni | ................. H04L 12/10 |

(Continued)

FOREIGN PATENT DOCUMENTS

EP 3300295 A1 3/2018

OTHER PUBLICATIONS

Notification of Transmittal of the International Search Report and the Written Opiniion of the International Searching Authority, or the Declaration; dated Aug. 15, 2019; 8 pages; PCT/US 2019/026802.

*Primary Examiner* — Michael R. Fin
(74) *Attorney, Agent, or Firm* — Ray A. King; Frank D. Cimino (57) ABSTRACT

In one embodiment, a system includes a power delivery ("PD") controller in a USB Type-C system that includes a configuration channel ("CC"), PD preamble detector, and a power-usage circuit. The PD controller includes a CC input that receives a PD message. The PD preamble detector is configured to detect a PD message preamble based in part upon a power of a filtered PD message and communicates a wake-up signal to the power-usage circuit in response to detecting a PD message preamble. The power-usage circuit is configured to exit a low-power mode in response to receiving the wake-up signal.

19 Claims, 5 Drawing Sheets

(56) References Cited

U.S. PATENT DOCUMENTS

| | | | |
|---|---|---|---|
| 2005/0036568 A1* | 2/2005 | De Ruijter | H04L 25/062 375/316 |
| 2008/0283876 A1 | 11/2008 | Souda | |
| 2008/0283879 A1* | 11/2008 | Choi | H01L 29/7833 257/288 |
| 2011/0222866 A1 | 9/2011 | Mashimo et al. | |
| 2013/0200841 A1 | 8/2013 | Farkas | |
| 2014/0073869 A1* | 3/2014 | Rodriguez-Llorente | A61B 5/7246 600/502 |
| 2015/0286605 A1* | 10/2015 | Waters | G06F 13/382 710/105 |
| 2015/0362984 A1 | 12/2015 | Waters et al. | |
| 2018/0152147 A1 | 5/2018 | Gabai | |
| 2019/0236040 A1 | 8/2019 | Armstrong | |
| 2020/0162065 A1* | 5/2020 | Wang | H03K 5/156 |

\* cited by examiner

LOW-POWER MODE FOR A USB TYPE-C POWER DELIVERY CONTROLLER

CROSS-REFERENCE TO RELATED APPLICATION(S)

This continuation application claims priority to U.S. patent application Ser. No. 15/949,841, filed Apr. 10, 2018, which application is incorporated herein by reference in its entirety.

TECHNICAL FIELD

This disclosure generally relates to a power delivery ("PD") controller, and, in particular, a PD controller in a USB Type-C environment.

BACKGROUND

USB power delivery ("PD") and Type-C specifications have been released that enable power delivery over new USB Type-C cables and connectors. The communication link across the ports of source devices and sink devices are connected via a USB Type-C connector, and the communication between the devices are defined by the USB PD specification. In particular, the USB PD specification enables devices to deliver or sink power over the connector.

In order to transfer power from the source device to the sink device, the source device and sink device send and receive PD messages across the communication channel ("CC") in order to negotiate voltage, current, and exchange other information. In many applications, minimizing the quiescent current in the source device and sink device during inactivity is important.

SUMMARY OF PARTICULAR EMBODIMENTS

Conventionally, regardless if the power delivery ("PD") controller is not anticipating sending and/or receiving a message, the components in a PD controller remain active (e.g., operating with full power) when a cable is connected to the PD controller.

The disclosure describes one or more embodiments that may minimize the quiescent current of the PD controller. In one embodiment, a system includes a PD controller in a USB Type-C system that includes a configuration channel ("CC"), PD preamble detector, and a power-usage circuit. The PD controller includes a CC input that receives a PD message. The PD preamble detector is configured to detect a PD message preamble based in part upon a power of a filtered PD message and communicates a wake-up signal to the power-usage circuit in response to detecting a PD message preamble. The power-usage circuit is configured to exit a low-power mode in response to receiving the wake-up signal.

The disclosure may present several technical advantages. Technical advantages of the system may include minimizing quiescent current of the PD controller. An additional technical advantage of the system may include efficiently operating necessary components in a PD controller. Moreover, another technical advantage of the system may include optimizing of a power supply's usage. In addition, another technical advantage of the system may include improving heat dissipation in a PD controller. Additionally, another technical advantage of the system may include efficient power management.

Other technical advantages of the present disclosure will be readily apparent to one skilled in the art from the following figures, descriptions, and claims. Moreover, while specific advantages have been enumerated above, various embodiments may include all, some, or none of the enumerated advantages.

Moreover, the embodiments disclosed herein are only examples, and the scope of this disclosure is not limited to them. Particular embodiments may include all, some, or none of the components, elements, features, functions, operations, or steps of the embodiments disclosed above.

BRIEF DESCRIPTION OF THE DRAWINGS

Aspects of the disclosure may be implemented in certain parts, steps, and embodiments that will be described in detail in the following description and illustrated in the accompanying drawings in which like reference numerals indicate similar elements. It will be appreciated with the benefit of this disclosure that the steps illustrated in the accompanying figures may be performed in other than the recited order and that one or more of the steps disclosed may be optional. It will also be appreciated with the benefit of this disclosure that one or more components illustrated in the accompanying figures may be positioned in other than the disclosed arrangement and that one or more of the components illustrated may be optional.

DESCRIPTION OF EXAMPLE EMBODIMENTS

This disclosure describes a system that may minimize the quiescent current for the power delivery ("PD") controller. In one embodiment, a system includes a PD controller in a USB Type-C system that includes a configuration channel ("CC"), PD preamble detector, and a power-usage circuit. The PD controller includes a CC input that receives a PD message. The PD preamble detector is configured to detect a PD message preamble based in part upon a power of a filtered PD message and communicates a wake-up signal to the power-usage circuit in response to detecting a PD message preamble. The power-usage circuit is configured to exit a low-power mode in response to receiving the wake-up signal.

Figure 1:
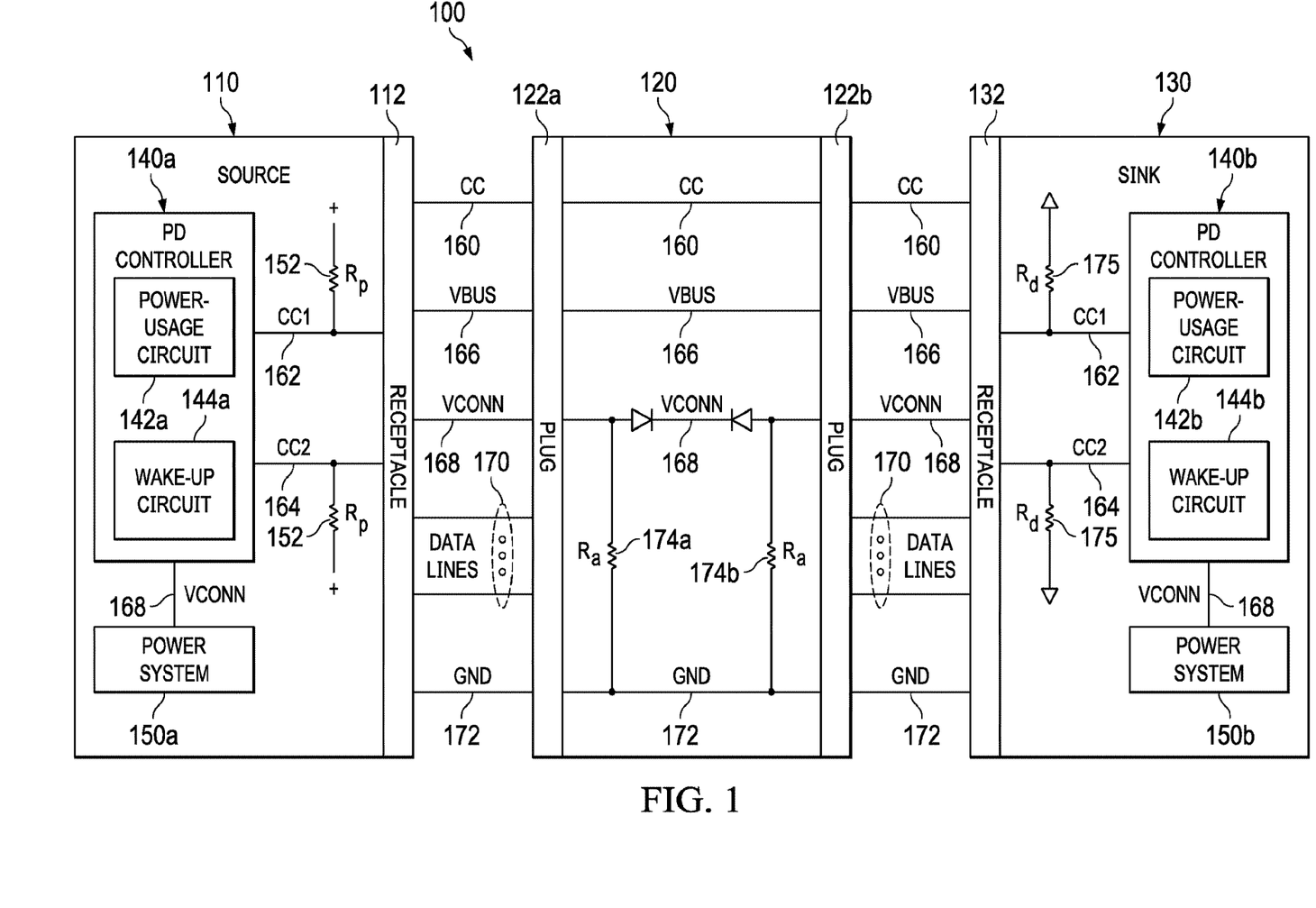
FIG. 1 illustrates an example system architecture of a USB Type-C environment with a source device, a connector, and a sink device.

FIG. 1 illustrates example system architecture 100 of a USB Type-C environment with source device 110, cable 120, and sink device 130. System architecture 100 comprises source device 110, cable 120, and sink device 130. Cable 120 is USB Type-C compatible, and connects source device 110 and sink device 130 such that source device 110 and sink device 130 communicate with each other. In addition, cable 120 may allow source device 110 to transfer power to sink device 130. Source device 110 comprises source-side receptacle 112, PD controller 140a, power system 150a, and pull-up resistor ("Rp") 152. Sink device comprises sink-side receptacle 132, PD controller 140b, power system 150b, and pull-down resistor ("Rd") 175. PD controller 140a and PD controller 140b may comprise similar components and configurations in both source device 110 and sink device 130. In addition, cable 120 may comprise first plug 122a and second plug 122b. Because the USB Type-C standard promotes reversible connectors, first plug 122a and second plug 122b can be connected to either source device 110 via source-side receptacle 112 or sink device 130 via sink-side receptacle 132. In addition, first plug 122a and second plug 122b can be connected to either source device 110 or sink device 130 in a normal orientation or in a flipped orientation.

PD controller 140a in source device 110 may be comprised of power-usage circuit 142a and wake-up circuit 144a. PD controller 140b in sink device 130 may also comprise power-usage circuit 142b and wake-up circuit 144b. In certain embodiments, power-usage circuit 142a in source device 110 and power-usage circuit 142b in sink device 130 are similar in architecture. Similarly, wake-up circuit 144a in source device 110 and wake-up circuit 144b in sink device 130 may also be similar in architecture in certain embodiments.

System architecture 100 also utilizes various ports, communication lines, and communication signals to communicate and transfer power between components. Example communication lines include CC line 160 (which may carry CC1 signal 162 or CC2 signal 164), Vbus line 166, Vconn line 168, data lines 170 (which as illustrated may be one or more data lines 170), and GND connection 172.

Source device 110 may include any device that is USB Type-C compatible, and may transmit information to sink device 130. The source monitors the DC voltage on the CC1 and CC2 pins to determine when sink device 130 is connected and/or disconnected. After detecting a sink connection, source device 110 applies power to Vbus 166. In certain embodiments, source device 110 can swap roles to become sink device 130 and vice versa. Moreover, source device 110 may receive information from sink device 130. Typically, source device 110 provides power over Vbus 166 to sink device 130 and Vconn 168 to cable 120. An example source device 110 includes a USB Type-C compatible monitor that receives data from the laptop's downstream facing port. In this example, the Type-C compatible monitor may also charge the laptop. Another example of a source device 110 is a USB Type-C compatible power brick or wall adapter whose purpose is to charge sink devices 130 (e.g., mobile phones and laptops).

Source device 110 may comprise source-side receptacle 112. Receptacle 112 may be any type of pinout that transmits and/or receives data, power, and/or video via cable 120. For example, source-side receptacle 112 may transmit video information, USB data, and/or power from source device 110 via cable 120. As another example, source-side receptacle 112 may receive video information and/or USB data from sink device 130 via cable 120. Source-side receptacle 112 in source device 110 may be substantially similar to sink-side receptacle 132 in sink device 130.

Source device 110 may also include PD controller 140a, and sink device 130 may include PD controller 140b. PD controller 140 is required in USB Type-C systems according to the USB PD specification. The USB PD specification outlines the flexible power delivery and power negotiations between source device 110 and sink device 130. PD controller 140 supports PD negotiations and controls PD messaging to send messages that advertise power level, requests power level, and acknowledge a channel's power level. The format of the communication across the CC lines is also dictated by USB PD specification. PD controller 140 may be similar when implemented in source device 110 (e.g., PD controller 140a) or sink device 130 (e.g., PD controller 140b). PD controller 140 may comprise one or more power-usage circuits 142 and wake-up circuits 144.

Power-usage circuit 142 is any type of component that utilizes power within PD controller 140. For example, power-usage circuit 142 may be an oscillator, an interface, memory, logic, receiver, transmitter, and/or a microcontroller unit ("MCU"). Moreover, power-usage circuit 142 may decode the bits in a received PD message. In certain embodiments, power-usage circuit 142 may have two stages: a first stage that allows power-usage circuit 142 to operate under full-power conditions and a second stage that allows power-usage circuit 142 to operate under reduced power conditions. Power-usage circuit 142 may be similar when implemented in source device 110 (e.g., power-usage circuit 142a) or sink device 130 (e.g., power-usage circuit 142b).

Wake-up circuit 144 is any type of component that determines whether power-usage circuit 142 should be operating under a full-power setting or a reduced-power setting. Based on the determination on whether power-usage circuit 142 should be operating under full-power or a reduced power, wake-up circuit 144 directs power-usage circuit 142 to change to the determined condition. Wake-up circuit 144, in certain embodiments, may detect the preamble of the PD message and subsequently change power-usage circuit 142 to a full-power condition. In certain embodiments, wake-up circuit 144 is able to distinguish the preamble of the PD message from CC pulses due to load steps and DC voltage changes. For example, wake-up circuit 144 may ignore CC voltage increases due to a removal of sink device 130.

Source device 110 and/or sink device 130 may also include power system 150. Power system 150 may provide power to components within source device 110 (e.g., PD controller 140a) and/or cable 120. For example, power system 150 may be an electrical adaptor for a wall outlet, a laptop battery, or any other type of power system. In addition, source device 110 may provide power to cable 120 and/or sink device 130 using power system 150a. Power system 150 may be any type of power source (e.g., a battery or an electrical outlet). In certain embodiments, power system 150 may be similar when implemented in source device 110 (e.g., power system 150a) or sink device 130 (e.g., power system 150b).

In addition, source device 110 may include one or more Rp 152. In an alternative embodiment, Rp 152 may be implemented as one or more current sources. Source device 110 may adjust Rp 152 to advertise which current levels (e.g., default, 1.5 A, or 3 A) source device 110 supports. On the other hand, the resistance of Rd 175 establishes different voltages on CC line 160 that are used by sink device 130 to determine the maximum current it may draw.

Cable 120 may be an active cable that connects source device 110 to sink device 130. In particular, cable 120 plugs into source-side receptacle 112 of source device 110 and sink-side receptacle 132 of sink device 130. Typically, Vconn 168 is used to power cable 120. Conventionally, the unused CC line is used as Vconn 168 to provide power to cable 120. Cable 120 supports the transfer of data, power, and/or video using the USB Type-C protocol. Cable 120 may be reversible in that each end of the cable is able to plug into source-side receptacle 112 of source device 110 and/or sink-side receptacle 132 of sink device 130. Moreover, cable 120 is able to be plugged in either a normal or inverted orientation.

Likewise, as illustrated, sink device 130 includes PD controller 140b (which includes power-usage circuit 142b and wake-up circuit 144b) and power system 150b. Sink device 130 may include any device that is USB Type-C compatible, and may receive information and/or power from source device 110. Sink device 130 monitors the DC voltage of the CC pin to determine the amount of power available from the source. The sink device monitors the voltage on Vbus in order to detect when the source is removed. Two common sinking devices are mobile phones and laptops.

CC line 160 allows for the communication and power negotiation between source device 110 and sink device 130. The communication across CC line 160 allows source device 110 to advertise what power levels it can support, and sink device 132 can request a supported power level. In certain embodiments, once a power level is agreed upon, the voltage and current levels in source device 110 and/or sink device 130 are adjusted. CC line 160 may be mechanically connected to CC1 signal 162 or CC2 signal 164 depending on the orientation of the plug when inserted into the receptacle. Typically, only one of CC1 signal 162 or CC2 signal 164 is connected across CC line 160 and the other of CC1 signal 162 or CC2 signal 164 remains open. The open line may be used as Vconn 168. The CC signal (either CC1 signal 162 or CC2 signal 164) that is connected is typically determined by the orientation of cable 120, and typically carries the PD message.

CC1 signal 160 and CC2 signal 164 typically is received by a CC pin that is connected to CC line 160. Source device 110 and/or sink device 130 may determine the orientation of cable 120 based on which CC pin is pulled down within a certain voltage range. CC1 signal 162 and/or CC2 signal 164 may be used for cable orientation and current advertisement. In certain embodiments either CC1 signal 162 or CC2 signal 164 may be used for CC line 160 and the other signal for Vconn 168.

Moreover, source device 110 applies a resistive pullup (i.e., Rp 152) or a current source individually to CC line 160. Source device 110 monitors the voltage on CC line 160 to detect when sink device 130 is attached. For example, when sink device 130 is attached, CC line 160 in source device 110 will have a resistive pull-down (e.g., Rd 175) on the line. Source device 110 and sink device 130 may then use CC line 160 to send and receive the PD message.

Vbus 166 is typically the power path between source device 110 and sink device 130. Conventionally, sink device 130 consumes power from Vbus 166. In certain embodiments, if sink device 130 is not connected to source device 110, then Vbus 166 sits at 0 V. On the other hand, if sink device 130 is connected to source device 110, then Vbus 166 may provide power to sink device 130.

Vconn 168 is typically the power path used to power the integrated circuit within cable 120. Either source device 110 and/or sink device 130 may source power on Vconn 168. Conventionally, the responsibility for supplying the Vconn 168 resides in PD controller 140. In certain embodiments, Vconn 168 can be supplied in either the pin connected to CC1 signal 162 or CC2 signal 164. Vconn 168 is typically transmitted on the CC pin that has remained open.

Data line 170 typically is received by one or more data pins on sink device 130 and/or source device 110. Data line 170 may transmit one or more data signals between source device 110 and sink device 130. In addition, one or more data pins on source device 110 and sink device 130 may transmit/receive data signals.

Ground line 172 provides a ground for system architecture 100. In certain embodiments, ground line 172 may introduce a resistive component to system architecture 100, and may cause a large voltage drop across cable 120. Specifically, the large voltage drop may cause a voltage offset for communications occurring between source device 110 and sink device 130.

Ra resistors 174a-b typically are used to pull down Vconn 168 to ground. Conventionally, source device 110 is not required to source Vconn 168 unless Ra resistors 174a-b are detected. The value for Ra resistors 174a-b are typically 1 kΩ, which is significantly smaller than the value for Rd resistors 175. Accordingly, source device 110 can distinguish between Rd resistors 175 and Ra resistors 174a-b. Once Vconn 168 is sourced, cable 120 may remove the resistance of Ra resistors 174a-b to reduce power consumption.

The system implements an Rp Type-C logic. By analyzing Rp 152 for source device 110 or Rd 175 for sink device 130, the device can determine whether another device is connected on the other end. For example, when sink device 130 is attached, CC line 160 in source device 110 will have a resistive pull-down (e.g., Rd 175) on the line. As another example, when source device 110 is attached, CC line 160 in sink device 130 will have a resistive pull-up (e.g., Rp 152) on the line.

Source device 110 may support either USB default, 1.5 A, or 3 A natively under the USB Type-C PD specification. Source device 110 can advertise its current carrying capability with a specific resistance value for Rp 152. Sink device 130 has a fixed value pulldown resistor (i.e., Rd 115) that, when connected, forms a voltage divider with Rp 152. By sensing the voltage before Rd 175, sink device 130 can detect the advertised current for source device 110.

In an exemplary embodiment, power-usage circuit 142 is in a low-power mode. For example, power-usage circuit 110 in either source device 110 or sink device 130 may be turned off (e.g., by not having power provided to the component) or may be in a sleep mode (e.g., operating at a lower frequency or at a reduced power state).

The device (either source device 110 or sink device 130) may receive a PD message through CC line 160 as CC1 signal 162 or CC2 signal 164. Wake-up circuit may detect the preamble of the PD message, and, in turn, may direct power-usage circuit 142 to exit the low-power mode. In certain embodiments, wake-up circuit 144 may communicate a wake-up signal that either resumes power to power-usage circuit 142 or causes power-usage circuit to exit the low-power mode.

The wake-up signal may be any type of signal that conveys information in the signal. The wake-up signal may be a digital signal, and may indicate whether power-usage circuit 142 should operate in low-power mode or full-power mode. For example, a binary signal high/low may be used to enable/disable the full-power mode. In another embodiment, the wake-up signal may be an analog signal with the signal characteristics (e.g., voltage, signal phase, current) may indicate the information in the signal. For example, a power transistor may supply current to power-usage circuit 142 when a wake-up signal is received.

Power-usage circuit 142 may return to low-power mode after either power-usage circuit 142 or wake-up circuit 144 determines a period of inactivity on CC line 160. For example, a period of inactivity may occur if no PD message is received within a minimum time (e.g., 2 ms), if the CC voltage no longer meets a wake-up condition within a certain time (e.g., 20 μs), if CC line 160 no longer contains rising and/or falling edges (which would typically be present during a PD message), and/or if wake-up circuit 144 detects an end-of-packet ("EOP") in the PD message.

Figure 2:
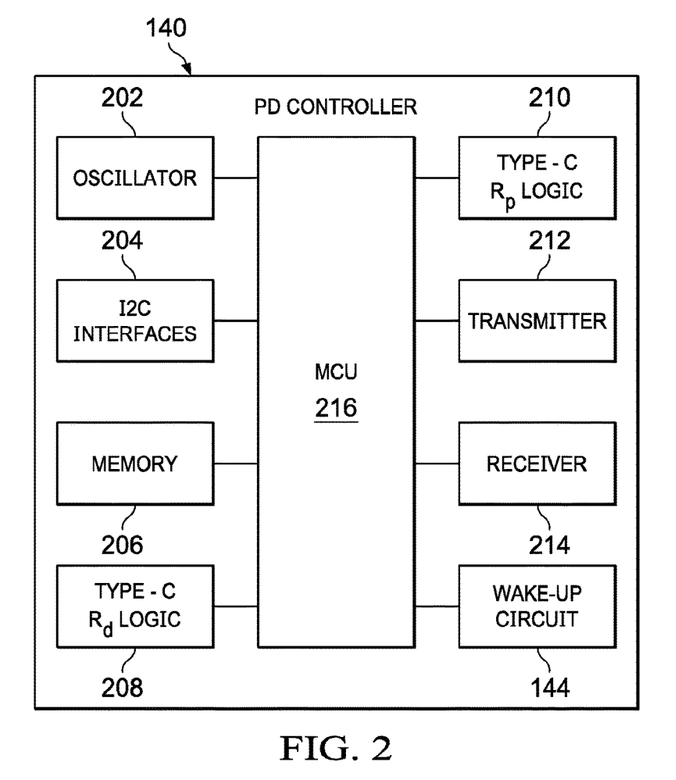
FIG. 2 is an example system diagram of a PD controller.

FIG. 2 is an example system diagram of PD controller 140. PD controller 140 may comprise power-usage circuit 142, wake-up circuit 144, and MCU 216. In the illustrated embodiment, oscillator 202, Inter-Integrated Circuit ("I2C") interfaces 204, memory 206, Type-C Rd logic 208, Type-C Rp logic 210, transmitter 212, receiver 214, and MCU 216 are example power-usage circuits 142. Oscillator 202, I2C interfaces 204, memory 206, Type-C Rd logic 208, Type-C Rp logic 210, transmitter 212, receiver 214, and wake-up circuit 144 are all connected to MCU 216. In certain embodiments, MCU 216 is able to direct and dictate the operations performed by and mode operated under other power-usage circuit(s) 142.

Oscillator 202 in PD controller 140 may be used to generate oscillating electric currents or voltages. While illustrated as a single oscillator 202, PD controller 140 may contain multiple oscillators 202. In certain embodiments, oscillator 202 may operate in a low-power mode or a full-power mode. In the low-power mode, oscillator 202 may produce slower oscillations, thereby preserving power, or may be turned off. In full-power mode, oscillator 202 may produce faster oscillations than under the low-power mode.

I2C interfaces 204 are one or more interfaces that allow communication between PD controller 140 and other components external to PD controller 140. Communication stemming from I2C interfaces 204 may be controlled by the I2C protocol. In certain embodiments, I2C interfaces 204 may operate in a low-power mode or a full-power mode. In a low-power mode, I2C interfaces 204 may be in a sleep mode or may be turned off. In full-power mode, I2C interfaces 204 to operate under full-power conditions such that the I2C interfaces 204 may transmit and/or receive I2C communications.

Memory 206 is a component that stores, permanently or temporarily, program information or data. While illustrated as a single memory 26, PD controller 140 may contain multiple memory units 206. In certain embodiments, memory 206 may operate in a low-power mode or a full-power mode. In a low-power mode, memory 206 may be in a sleep mode or may be turned off. In full-power mode, memory 206 may operate under full-power conditions such that memory 206 may store program information or data.

Type-C Rd logic 208 is used by sink device 130 to detect how much power source device 110 can provide. Type-C Rd logic 208 monitors the DC voltage on CC line 160 to detect whether Rp resistor 152 is attached and/or detached. Based on Rp resistor 152, sink device 130 is able to detect how much power source device 110 can provide.

Type-C Rp logic 210 comprises logic that applies one of three current sources to CC line 160 and is located on source device 110. Type-C Rp logic 210 may also contain logic that monitors the voltage on CC line 160 against a disconnect threshold (thereby determining whether a device has been disconnected) and the voltage against a Ra/Rd threshold to determine whether an active cable is connected. Source device 110 detects when sink device 130 is attached based on the DC voltage of the CC line 160. Specifically, when the DC voltage falls below a certain Rd threshold but above a certain Ra threshold, source device 110 is able to determine that sink device 130 is attached. If the DC voltage of CC line 160 falls below the Ra threshold, source device 110 is able to determine that Ra resistor 174a is attached. In some other usage scenarios (not shown in FIG. 1), the source may have an Rd resistor attached to both CC1 and CC2 or Ra resistors attached to both CC1 and CC2, then source device 110 knows that either a debug accessory or an audio accessory is attached. If source device 110 detects Rd resistor 175 on CC1 and an open on CC2, then sink device 130 is attached through a passive cable. If source device 110 detects Rd resistor 175 on CC1 and Ra resistors 174a-b on CC2, then sink device 130 is attached through an active cable. Source device 110 may or may not apply power to Vconn 168, but active cables require power on Vconn 168 to achieve its full functionality. Source device 110, in certain embodiments, may send PD messages to a controller inside the active cable to determine its operational characteristics. In addition, the digital control logic within Type-C Rp logic 210 can enable a specific Rp current source and monitor the status of the comparators in the device.

Transmitter 212 may be any component that transmits information from PD controller 140. In certain embodiments, transmitter 212 may operate in a low-power mode or a full-power mode. In a low-power mode, transmitter 212 may be in a sleep mode or may be turned off. In full-power mode, transmitter 212 may operate under full-power conditions such that transmitter 212 may transmit information from PD controller 140.

Receiver 214 may be any component that receives information for PD controller 140. In certain embodiments, receiver 214 may comprise components and/or logic that perform the following functionality: (1) a preamble, start of packet, and/or packet detector; (2) 5b4b decoder; (3) cyclic redundancy check calculator and checker; and/or (4) data receiver. Any of these components within receiver 214 and/or receiver 214 itself may operate in a low-power mode or a full-power mode. In a low-power mode, receiver 214 and/or one or more components in receiver 214 may be turned off or put in sleep mode. In full-power mode, receiver 214 and/or one or more components receiver 214 may operate under full-power conditions.

MCU 216 is a microcontroller unit in PD controller 140. Conventionally, a microcontroller, like MCU 216, may contain one or more processor cores along with memory and/or programmable input output peripherals. MCU 216 may be used for controlling handling, communication, processing, storing, and/or operating one or more components in PD controller 140. While illustrated as a single MCU 216, PD controller 140 may contain multiple MCUs 216. MCU 216 may operate in a low-power mode or a full-power mode. In a low-power mode, MCU 216 and/or one or more components (e.g., programs, functionality, etc.) with MCU 216 may be turned off or put in sleep mode. In full-power mode, MCU 216 and/or one or more components in MCU 216 may operate under full-power conditions.

In an exemplary embodiment, power-usage circuit 142 (e.g., oscillator 202, I2C interfaces 204, memory 206, Type-C Rd logic 208, Type-C Rp logic 210, transmitter 212, receiver 214, and MCU 216) may be in a low-power mode. Wake-up circuit 144 may detect a preamble of an incoming PD message. Upon detection, wake-up circuit 144 communicates a wake-up signal to power-usage circuit 142 (e.g., oscillator 202, I2C interfaces 204, memory 206, Type-C Rd logic 208, Type-C Rp logic 210, transmitter 212, receiver 214, and MCU 216). In response, power-usage circuit 142 exits the low-power mode and may operate in full-power mode. In certain embodiments, wake-up circuit 144 may communicate a wake-up signal to MCU 216, and MCU 216 directs one or more power-usage circuits 142 to exit the low-power mode.

Power-usage circuit 142 may return to low-power mode after either power-usage circuit 142, MCU 216, and/or wake-up circuit 144 determines a period of inactivity on CC line 160. For example, a period of inactivity may occur if no PD message is received within a minimum time (e.g., 2 ms), if the CC voltage no longer meets a wake-up condition within a certain time (e.g., 20 μs), if CC line 160 no longer contains rising and/or falling edges (which would typically be present during a PD message), and/or if wake-up circuit 144 detects an end-of-packet ("EOP") in the PD message.

Figure 3:
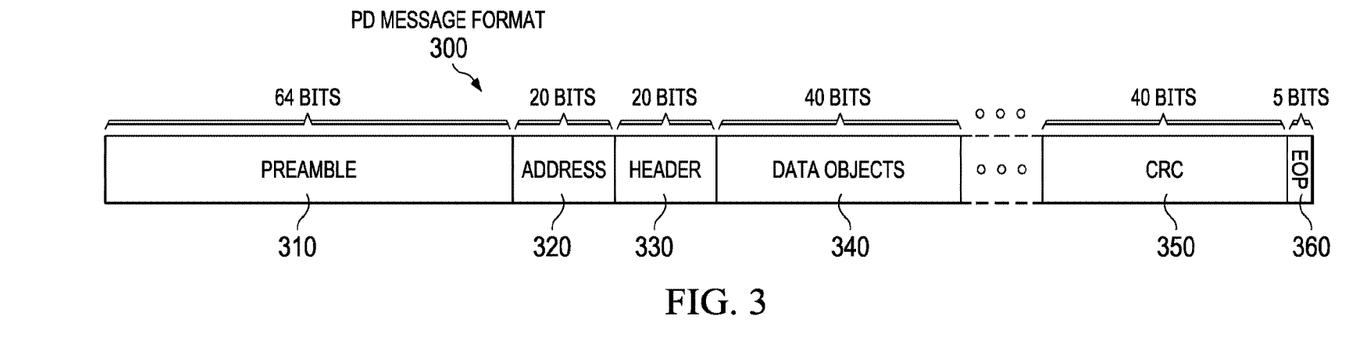
FIG. 3 is an exemplary PD message.

FIG. 3 is exemplary PD message 300. PD message 300 may be a control message or a data message. The USB-PD communication protocol is transmitted at 300 kbps over CC line 160. Typically, the voltage of PD message 300 toggles between 1.1V and 0V with the duration of each pulse being used to decode 0's and 1's. PD controller 140 may receive PD message as a digital message, and wake-up circuit 144 may convert the digital PD message to an analog signal. The format for PD message 300 may include preamble 310, address 320, header 330, data objects 340, cyclical redundancy check ("CRC") 350, and EOP 360. The format for PD message 300 is outlined in USB PD specification (herein incorporated by reference), and PD message 300 is typically communicated between source device 110 and sink device 130. PD message 300 approximately has a 50% duty-cycle, and the average voltage on the CC line during PD message 300 has maximum and minimum.

The first 64 bits of PD message 300 is preamble 310. Preamble 310 may contain information such that the receiver can synchronize with the transmitted clock. For example, the receiver first has to determine the bit width of the incoming signal. The preamble contains a known sequence (e.g., alternating 0's and 1's for example) so that the bit width can be calculated by the receiver. Then if there is a high-to-low or low-to-high transition in the middle of the bit interval, it is decoded as a '1'; otherwise, it is decoded as a '0'. At the end of every bit interval, there is a high-to-low or a low-to-high transition. After determining the bit width of the incoming signal, the duration of high and low pulses in preamble 310 are used to decode 0's and 1's. In certain embodiments, the receiver may only need to receive a portion of the 64 bits of preamble 310 in order to prepare for the upcoming signal.

The next 20 bits of PD message 300 is address 320. Address 320 may contain the message address indicating the message recipient or other type of information (e.g., start-of-packet information).

The next 20 bits of PD message 300 is header 330. Header 330 contains the message header and a data object count. Data object count specifies the number of 40-bit data objects that follow header 330. A data object count of zero indicates that the message type is a control signal. If the data object count is between 1 and 7, then up to seven 40-bit data objects 340 follow in the message type is data.

Data objects 340 are a portion of PD message 300 that carries the transmitted data information. In control messages of PD message 300, data objects 340 may be omitted. Data objects 340 may include information indicating capabilities of the connected device, power negotiation messaging, built-in self test ("BIST"), and/or custom messaging defined by the original equipment manufacturer.

Following data objects 340 is CRC 350. CRC 350 is a type of redundancy check that detects if there are accidental decoding errors in the received message. MCU 216 may calculate a CRC to ensure that is the same as the transmitted CRC in CRC 350. The last five bits of PD message 300 is EOP 360. EOP 360 completes the message.

Figure 4:
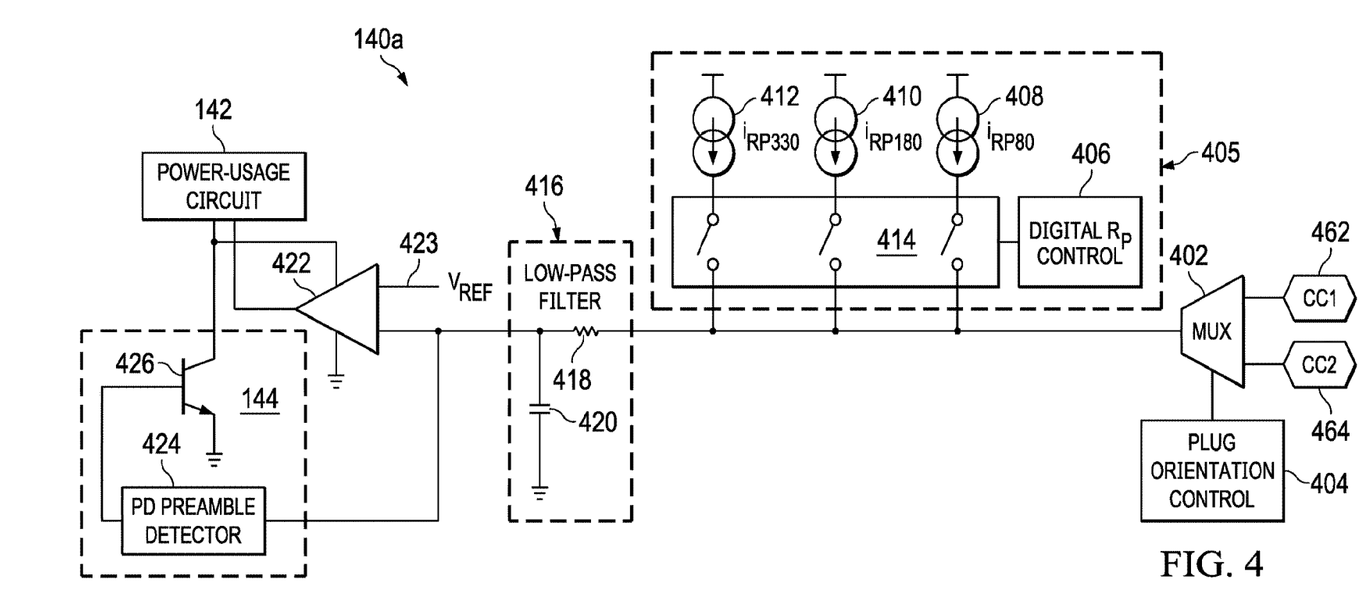
FIG. 4 is an exemplary circuit diagram of PD controller 140a receiving either a CC1 signal or a CC2 signal on a source device.

FIG. 4 is an exemplary circuit diagram of PD controller 140a receiving either CC1 signal 162 or CC2 signal 164 on source device 110. PD controller 144 may comprise multiplexer 402, plug orientation control 404, Rp system 405 (comprising digital Rp control 406, current source RP80 408, current source RP180 410, current source RP330 412, and switch gate 414), low-pass filter 416 (comprising low-pass resistor 418 and low-pass capacitor 420), comparator 422, wake-up circuit 144 (comprising PD preamble detector 424 and power transistor 426), and power-usage circuit 142.

Multiplexer 402 may receive PD message 300 on CC1 signal 162 and/or CC2 signal 164, and may properly multiplex the correct signal to PD controller 140. For example, if CC1 signal 162 is active, multiplexer 402 may pass on CC1 signal 162. Similarly, if CC2 signal 164 is active, multiplexer 402 may pass on CC2 signal 164. Plug orientation control 404 may assist multiplexer 402 in making the determination on whether to pass CC1 signal 162 or CC2 signal 164. For example, plug orientation control 404 may take into account whether plug 122 of cable 120 is in a normal orientation or an inverted orientation.

Rp system 405 comprises digital Rp control 406, current source RP80 408, current source RP180 410, current source RP330 412, and switch gate 414. In alternative embodiments, current source RP80 408, current source RP180 410, and current source RP330 412 may be implemented as pull-up resistors that vary the current based on the resistance of Rp 152. Source device 110 may adjust the current source (or resistor) to advertise which current levels (e.g., default, 1.5 A, or 3 A) it supports. The value of Rp establishes a voltage on CC line 160 that is used by sink device 130 to determine the maximum current it may draw. Rp system 405 exists in source device 110; however, sink device 130 conventionally does not incorporate Rp system 405. However, some systems can be either source device 110 or sink device 130, in which case they have both Rd logic 208 and Rp logic 210.

Digital Rp control 406 is a controller in Rp system 405 that selects and controls the advertised current from current source RP80 408, current source RP180 410, and current source RP330 412. Based on the current source selected, a corresponding voltage threshold exists such that the device is able to determine whether the CC pin is active.

Based on the advertised current, source device 110 determines whether a voltage is below a disconnect threshold. In addition, source device 110 determines whether the voltage is above a threshold established by Ra 174 and Rd 175. Conventionally, Ra 174 is much smaller than Rd 175. The sink device 130 determines whether a voltage is above a disconnect threshold. In addition, it determines which of three ranges the voltage falls within. Each of the voltage ranges corresponds to how much power sink device 130 may draw from source device 110 (e.g., default, 1.5 A, or 3.0 A).

In order to determine which line is the CC line 160 and which line is Vconn 168, source device 110 analyzes the voltage on the line-in-question. For example, if RP180 410 is applied and the voltage at the line-in-question is above 1.6V (i.e., the maximum voltage applied to CC line 160), then no connection is present. However, if the voltage at the line-in-question is less than 0.25V, then Ra 174 is present because of the large voltage drop introduced by Ra 174 and, consequently, making the line-in-question Vconn 168. Finally, if the voltage is between 0.25V and 1.6V, then only Rd 175 is present, and, consequently, making the line-in-question CC line 160.

Current source RP80 408, current source RP180 410, and current source RP330 412 are current sources that are individually active based on a combination of digital Rp control 406 and switch gate 414. Only one of the current sources is active at a single time, and can be used by source device 110 to advertise its current capabilities.

When connected, source device 110 can change the current source dynamically. Rp 152 can indicate additional information. For example, if the resistance of Rp 152 is 330 µA, then sink device 130 can transmit information. On the other hand, if the resistance of Rp 152 is 180 µA, then sink device 130 cannot initiate a regular transmission.

Low-pass filter 416 is intended to reduce noise introduced in either CC1 signal 162 or CC2 signal 164. For example, unwanted noise may be introduced by cross-talk between CC1 signal 162/CC2 signal 165 and data lines 170. Low-pass filter 416 may comprise low-pass resistor 418 and low-pass capacitor 420. Low-pass filter 416 is coupled to (1) the output of multiplexer 402 and (2) an active current source of current source RP80 408, current source RP180 410, or current source RP330 412.

Comparator 422 is a comparator that compares the signal outputting from low-pass filter 416 and referential voltage 423. Comparator 422 is coupled to the output of low-pass filter 416. Comparator 422 detects when the incoming signal is high or low, so that the binary 1's and 0's can be decoded. Referential voltage 423 is changed depending on whether the voltage is presently high or low (i.e., the falling and rising thresholds are different). As described earlier, the bits are decoded based on the time the voltage is high and how long the voltage is low. Since these high/low pulses are as short as 1.5 µs, comparator 422 may need to quickly react and process these pulses.

Wake-up circuit 144 comprises PD preamble detector 424 and power transistor 426. PD preamble detector 424 is able to receive a signal from low-pass filter 416 and determine whether the signal is a preamble to PD message 300. A circuit diagram of PD preamble detector 424 can be found in FIGS. 5 and 6. Moreover, the accompanying description in FIGS. 5 and 6 disclose example embodiments for the detection of a preamble in PD message 300. PD preamble detector 424 is configured to detect a preamble of PD message 300, filter the PD message to a filtered signal, and based on the power of the filtered signal, communicate a wake-up signal to power transistor 426 and/or power-usage circuit 142 in response to detecting a preamble of PD message 300.

Power transistor 426 may comprise a control gate (e.g., gate) and a channel gate (e.g., source or drain). The control gate of power transistor 426 may receive a wake-up signal from PD preamble detector 424, thereby causing a channel gate of power transistor 426 to provide a current to power-usage circuit 142.

PD preamble detector 424 may continue to communicate a wake-up signal in certain embodiments, so long as PD message 300 is being transmitted. In alternative embodiments, PD preamble detector 424 may communicate a single wake-up signal once a preamble of the PD message is detected. In certain embodiments, power transmitter 426 is omitted and PD preamble detector 424 communicates the wake-up signal directly to power-usage circuit 142. Once power-usage circuit 142 is operating at full power, power-usage circuit 424 may ignore further wake-up signals in certain embodiments until power-usage circuit returns to the low-power mode.

Figure 5:
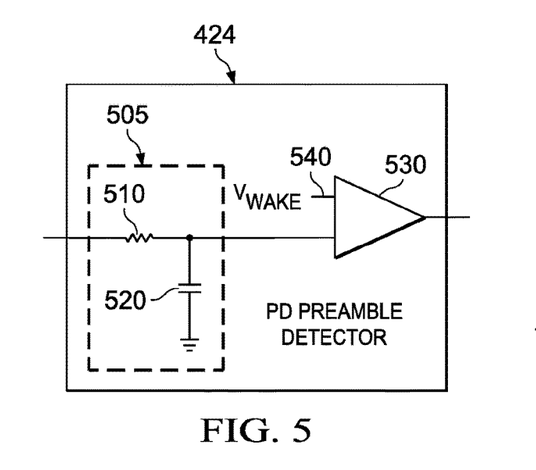
FIG. 5 is an exemplary embodiment of a PD preamble detector using a low-pass filter in a source device.

FIG. 5 is an exemplary embodiment of PD preamble detector 424 using low-pass filter 505 in source device 110. PD preamble detector 424 comprises low-pass filter 505 (comprising low-pass resistor 510 and low-pass capacitor 520) and comparator 530. Comparator 530 receives referential wake-up voltage 540.

Low-pass filter 505 filters the received PD message to a filtered signal that is representative of the average value of the received PD message. Low-pass filter 505 may be implemented as a first order passive low-pass filter circuit (as depicted in FIG. 5), but may also be implemented as a variety of other low-pass filter implementations (e.g., second order low-pass filter, higher order low-pass filters, operational amplifiers, etc.).

In the illustrated embodiment, low-pass filter 505 is a first order passive low-pass filter comprising low-pass resistor 510 and low-pass capacitor 520. Low-pass resistor 510 and low-pass capacitor 520 combine to form a passive RC filter that prohibits higher frequencies. Low-pass capacitor 520 exhibits larger reactance at low frequencies and smaller reactance at high frequencies. At higher frequencies the reactance drops, and the capacitor effectively functions as a short circuit. This means that low-pass filter 505 generally permits only the low-frequency content to pass through.

Because the PD communication occurs at higher frequencies and includes a DC bias, low-pass filter 505 causes the output signal to go high when no PD communication is occurring. On the other hand, low-pass filter 505 causes the output signal to be lower when low-pass filter 505 receives a PD communication primarily due to the high-frequency switching and approximately 50% duty cycle of PD communications.

Comparator 530 compares the incoming power of the filtered signal from low-pass filter 505 with referential wake-up voltage ("Vwake") 540. If the voltage falls below and/or is equal to Vwake, then a wake-up signal is transmitted to either power transmitter 426 and/or power-usage circuit 142. In an alternative embodiment, the wake-up signal is communicated to MCU 216, and MCU 216 subsequently directs power-usage circuit 142 to exit low-power mode. Once the CC line is idle again (i.e., there is no ongoing PD message), power-usage circuit 142 enters a low-power mode to save power. In certain embodiments, comparator 530 can react slower than comparator 422. For example, the time constant of low pass filter 505 may be such that the CC voltage only falls below Vwake 540 after 32 bits of the preamble have passed (i.e., about 96 µs).

Comparator 530 operates when Rp is 330 µA. During that time, Vwake 540 can be between 0.9V and 1.24V as illustrated in the following table:

TABLE 1

| Vwake Value in Relation to Rp 152 | | | |
| --- | --- | --- | --- |
| Rp 152 | DC Bias [min, max] | $V_{rx}$ [min, max] | Vwake 540 |
| 330 µA ± 8% | [1.24 V, 2.43 V] | [0.5 V, 0.9 V] | Between .9 V and 1.24 V |

The Rp 152 column in Table 1 indicates the strength of Rp 152 and accuracy of the resistance as required by the USB Type-C specification. DC bias column in Table 1 indicates a maximum and minimum voltage at CC line 160 when there is no PD message (i.e., when the CC line 160 is idle). Received voltage during a transmission ("$V_{rx}$") column indicates a minimum and maximum voltage when receiving PD message 300. Finally, in exemplary embodiments, Vwake 540 column in Table 1 is set between the minimum voltage of the DC Bias (i.e., when CC line 160 is idle) and the maximum voltage of a received PD message. This ensures that the DC bias when there is no PD message will not drop below Vwake 540, and also ensures that the voltage during PD message 300 will fall below or equal Vwake 540. By keeping Vwake 540 between the minimum voltage of only DC bias and maximum voltage during PD message 300, Vwake 540 is set at a referential voltage for when a PD signal preamble is received. In certain embodiments, Vwake 540 may be set according to the following equation:

$$Vwake = \frac{\min(V\ DC\ Bias) + \max(V\ rx)}{2} \quad (1)$$

Min ($V_{DC\ Bias}$): Minimum voltage that may be seen at the input of comparator 530 when PD message 300 is not occurring.

Max ($V_{rx}$): Maximum voltage that may be seen at the input of comparator 530 during PD message 300.

In certain embodiments, the corner frequency for low-pass filter 505 can be adjusted to reduce the probability of a false alarm. For example, a maximum corner frequency for low-pass filter 505 may be set at 600 kHz. In addition, in certain embodiments, the wake-up signal communicated from comparator 530 is combined with an input indicating whether Rp 152 is at 330 µA using an AND logic gate. If the strength of Rp 152 is at 330 µA, then the wake-up signal will be valid and communicated to power transistor 426 and/or power-usage circuit 142. Otherwise, if the strength of Rp 152 is not at 330 µA, then PD preamble detector 424 will not communicate a wake-up signal to power transistor 426 and/or power-usage circuit 142.

Figure 6:
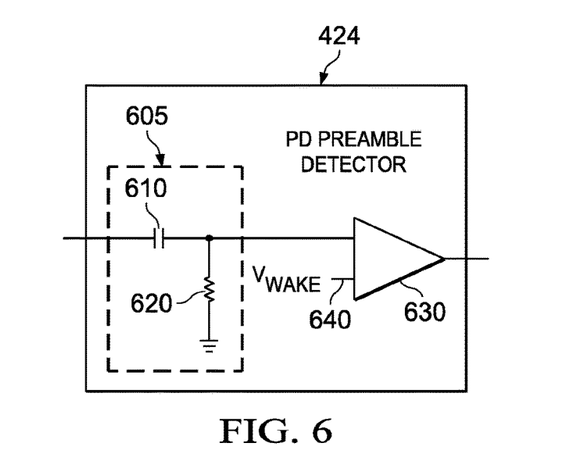
FIG. 6 is an exemplary embodiment of a PD preamble detector using a high-pass filter in either a source device or a sink device.

FIG. 6 is an exemplary embodiment of PD preamble detector 424 using high-pass filter 605 in either source device 110 or sink device 130. The illustrated embodiment of PD preamble detector 424 is operable regardless of the Rp resistance or current source selected. PD preamble detector 424 comprises high-pass filter 605 (comprising high-pass capacitor 610 and high-pass resistor 620) and comparator 630. Comparator 530 receives referential wake-up voltage 540.

High-pass filter 605 filters the received PD message to a filtered signal by removing the DC bias from the received PD message, and passes the analog signal to comparator 630. High-pass filter 605 may be implemented as a first order passive high-pass filter circuit (as depicted in FIG. 6), but may also be implemented as a variety of other high-pass filter implementations (e.g., second order high-pass filter, higher order high-pass filters, operational amplifiers, etc.).

In the illustrated embodiment, high-pass filter 605 is a first order passive high-pass filter comprising high-pass capacitor 610 and high-pass resistor 620. High-pass capacitor 610 and high-pass resistor 620 combine to form a passive RC filter that prohibits lower frequencies (e.g., the DC bias). The reactance of high-pass capacitor 610 is very high at low frequencies so the capacitor acts like an open circuit and blocks any input signals until a cut-off frequency point is reached. Above the cut-off frequency point (e.g., the PD message), the reactance of high-pass capacitor 610 has reduced sufficiently as to now act more like a short circuit allowing PD message to pass directly to the output.

Because the PD communication occurs at higher frequencies and includes a DC bias, high-pass filter 605 causes the output signal to go low when no PD communication is occurring and only the DC bias exists. On the other hand, high-pass filter 505 causes the output signal to be high when high-pass filter 605 receives a PD communication. The output signal will have similar high-to-low transitions and low-to-high transitions as the original signal, but without any DC bias.

Comparator 630 compares the incoming power of the filtered signal from the high-pass filter 605 with referential wake-up voltage ("Vwake") 640. If the voltage is above and/or equal to Vwake, then a wake-up signal is transmitted to either power transmitter 426 and/or power-usage circuit 142. In an alternative embodiment, the wake-up signal is communicated to MCU 216, and MCU 216 subsequently directs power-usage circuit 142 to exit low-power mode. Once the CC line is idle again, power-usage circuit 142 enters a low-power mode to save power. Since the input to comparator 630 has pulses similar to PD message 300, comparator 630 may need to react in less than 3 µs in certain embodiments as the longest high pulses may also be less than 3 µs.

Vwake 640 is set between the maximum voltage of the DC Bias at input 630 and the minimum peak voltage at input 630 during a received PD message. This ensures that the DC bias when there is no PD message will be below Vwake 640, and also ensures that the voltage during PD message 300 will go above or equal to Vwake 640. In certain embodiments, Vwake 640 may be set according to the following equation:

$$Vwake = \frac{\max(V\ DC\ Bias) + \min(V\ rx)}{2} \quad (2)$$

Max ($V_{DC\ Bias}$): Maximum voltage that may be seen at the input of comparator 630 when PD message 300 is not occurring.

Min ($V_{rx}$): Minimum peak voltage that may be seen at the input of comparator 630 during PD message 300.

In certain embodiments, the corner frequency of the high-pass filter can be adjusted to reduce the probability of a false alarm. For example, a minimum corner frequency for high-pass filter 605 may be set at 200 kHz.

Figure 7:
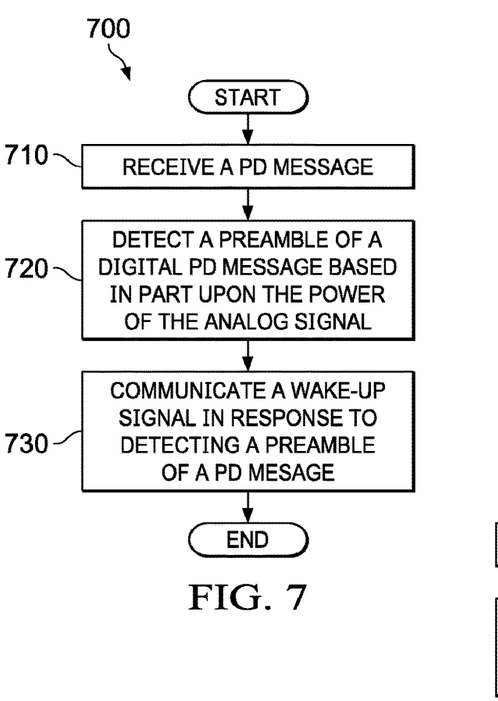
FIG. 7 illustrates an example method for minimizing the quiescent current for a PD controller.

FIG. 7 illustrates an example method 700 for minimizing the quiescent current for PD controller 140. The method may begin at step 710, where wake-up circuit 144 receives PD message 300 from CC line 160. In an exemplary embodiment, one or more power-usage circuits 142 in PD controller 140 are in low-power mode.

At step 720, wake-up circuit 144 detects a preamble of PD message 300 based in part upon the power of a filtered PD message. Wake-up circuit 144 may filter the PD message using low-pass filter 505, a high-pass filter 605, or any other filtering mechanism (e.g., digital-to-analog circuit) that filters the PD message to a filtered signal (e.g., an analog signal). In certain embodiments, wake-up circuit 144 compares the voltage of the analog signal to a referential voltage to detect a preamble of PD message 300. Based on the comparison of the voltage of the analog signal and the referential voltage, wake-up circuit 144 may discern whether the signal received is a preamble of PD message 300.

At step 730, wake-up circuit 144 communicates a wake-up signal in response to detecting a preamble of PD message 300. In certain embodiments, wake-up circuit 144 may communicate a wake-up signal to power transistor 426, and power transistor 426 provides power to one or more power-usage circuits 142. In alternative embodiments, wake-up circuit 144 may communicate a wake-up signal to MCU 216, and, in turn, MCU 216 may direct one or more power-usage circuits 142 to exit low-power mode. In an additional embodiment, wake-up circuit 144 may communicate a wake-up signal directly to one or more power-usage circuits 142.

Particular embodiments may repeat one or more steps of the method of FIG. 7, where appropriate. Although this disclosure describes and illustrates particular steps of the method of FIG. 7 as occurring in a particular order, this disclosure contemplates any suitable steps of the method of FIG. 7 occurring in any suitable order.

Figure 8:
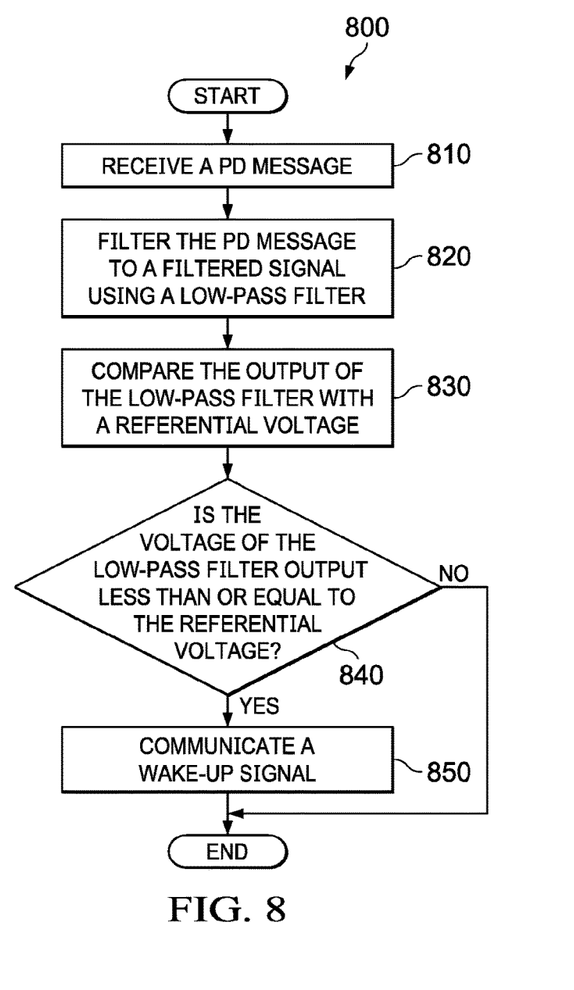
FIG. 8 illustrates an example method for minimizing the quiescent current for a PD controller using a low-pass filter.

FIG. 8 illustrates an example method 800 for minimizing the quiescent current for PD controller 140 using low-pass filter 505. The method may begin at step 810, where low-pass filter 505 receives PD message 300. In an exemplary embodiment, one or more power-usage circuits 142 in PD controller 140 are in low-power mode.

At step 820, low-pass filter 505 filters PD message 300 to a filtered message. The filtered message is an analog signal that is representative of the average value of the received PD message. Because PD communications occurs at higher frequencies, low-pass filter 505 causes the output signal to go high when no PD communication is occurring. On the other hand, low-pass filter 505 causes the output signal to be lower when low-pass filter 505 receives a PD communication.

At step 830, comparator 530 compares the voltage of the incoming signal from low-pass filter 505 with a referential voltage (i.e., Vwake 540). Vwake 540 may be set between the minimum voltage of the DC Bias (i.e., when CC line 160 is idle) and the maximum voltage of a received PD message. For example, Vwake 540 may be set at an average between a minimum voltage of comparator 530 without a received transmission and a maximum voltage of comparator 530 during a transmission At step 840, comparator 530 determines whether the voltage of the output of low-pass filter 505 is less than or equal to the referential voltage (i.e., Vwake 540). If the voltage falls below and/or is equal to Vwake 540, then the method moves to step 850. Otherwise, the method ends.

At step 850, a wake-up signal is transmitted to either power transmitter 426 and/or power-usage circuit 142. In an alternative embodiment, the wake-up signal is communicated to MCU 216, and MCU 216 subsequently directs power-usage circuit 142 to exit low-power mode.

Particular embodiments may repeat one or more steps of the method of FIG. 8, where appropriate. Although this disclosure describes and illustrates particular steps of the method of FIG. 8 as occurring in a particular order, this disclosure contemplates any suitable steps of the method of FIG. 8 occurring in any suitable order.

Figures 9, 10:
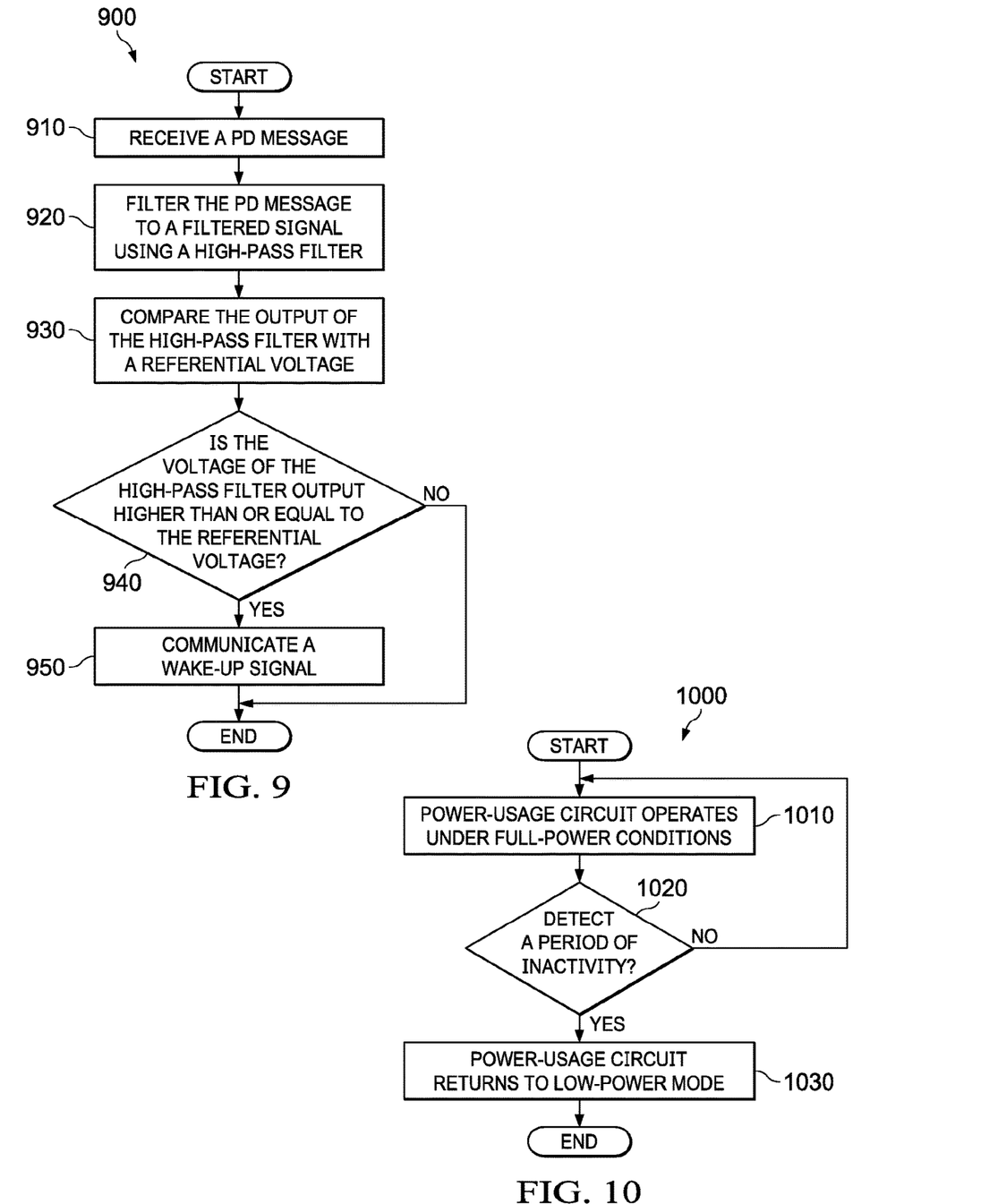
FIG. 9 illustrates an example method for minimizing the quiescent current for a PD controller using a high-pass filter.
FIG. 10 illustrates an example method for reverting back to a low-power mode for a power-usage circuit.

FIG. 9 illustrates an example method 900 for minimizing the quiescent current for PD controller 140 using high-pass filter 605. The method may begin at step 910, where high-pass filter 605 receives PD message 300. In an exemplary embodiment, one or more power-usage circuits 142 in PD controller 140 are in low-power mode.

At step 920, high-pass filter 605 filters PD message 300 to a filtered signal in the analog domain. Because the PD communication occurs at higher frequencies, high-pass filter 605 causes the output signal to go low when no PD communication is occurring and only the DC bias exists. On the other hand, high-pass filter 605 causes the output signal to be high when high-pass filter 605 receives a PD communication.

At step 930, comparator 630 compares the voltage of the incoming power from high-pass filter 605 with a referential voltage (i.e., Vwake 640). Vwake 640 may be set between the maximum voltage of the DC Bias and the minimum voltage of a received PD message. For example, Vwake 640 may be set at an average between a maximum voltage of comparator 630 without a received transmission and a minimum voltage of comparator 630 during a transmission.

At step 940, comparator 630 determines whether the voltage of the output of high-pass filter 605 is higher than or equal to the referential voltage (i.e., Vwake 640). If the voltage is above and/or is equal to Vwake 640, then the method moves to step 950. Otherwise, the method ends.

At step 950, a wake-up signal is transmitted to either power transmitter 426 and/or power-usage circuit 142. In an alternative embodiment, the wake-up signal is communicated to MCU 216, and MCU 216 subsequently directs power-usage circuit 142 to exit low-power mode.

Particular embodiments may repeat one or more steps of the method of FIG. 9, where appropriate. Although this disclosure describes and illustrates particular steps of the method of FIG. 9 as occurring in a particular order, this disclosure contemplates any suitable steps of the method of FIG. 9 occurring in any suitable order.

FIG. 10 illustrates an example method 700 for reverting back to a low-power mode for power-usage circuit 162. The method may begin at step 1010, where power-usage circuits 142 are operating under full-power conditions.

At step 1020, power-usage circuit 162 (e.g., MCU 216) and/or wake-up circuit 144 determines whether a period of inactivity has occurred. For example, a period of inactivity may occur if no PD message is received within a minimum time (e.g., 2 ms), if the CC voltage no longer meets a wake-up condition within a certain time (e.g., 20 µs), if CC line 160 no longer contains rising and/or falling edges (which would typically be present during a PD message), and/or if wake-up circuit 144 detects an end-of-packet ("EOP") in the PD message. For USB PD sources, a period of inactivity may only occur when the source is advertising using RP330 412. Therefore, in some embodiments, the source remains in step 1010 until RP330 412 is applied.

If a period of inactivity has not occurred, power-usage circuits 142 continue to operate under full-power conditions in step 1010. However, if a period of inactivity has occurred, the method proceeds to step 1030 where power-usage circuit 162 may return to low-power mode. In certain embodiments, MCU 216 determines whether a period of inactivity has occurred and directs other power-usage circuits 162 to return to low-power mode if a period of inactivity has occurred. In additional embodiments, wake-up circuit 162 determines whether a period of inactivity occurred, and directs one or more power-usage circuits 162 to return to low-power mode by no longer sending a wake-up signal and/or communicating a separate signal (e.g., a low-power signal).

Particular embodiments may repeat one or more steps of the method of FIG. 10, where appropriate. Although this disclosure describes and illustrates particular steps of the method of FIG. 10 as occurring in a particular order, this disclosure contemplates any suitable steps of the method of FIG. 10 occurring in any suitable order.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

By way of illustration and not of limitation, the accompanying figures show specific embodiments in which the subject matter may be practiced. It is noted that arrows at one or both ends of connecting lines are intended to show the general direction of electrical current flow, data flow, logic flow, etc. Connector line arrows are not intended to limit such flows to a particular direction such as to preclude any flow in an opposite direction.

As used herein, channel electrode means an element of a device that carries current through the device such as a source or a drain of a metal-oxide-semiconductor field-effect transistor ("MOSFET") or an emitter or a collector of a bipolar transistor, and a control electrode means an element of the device that controls current through the device such as a gate of a MOSFET or a base of a bipolar transistor. Moreover, terms such as coupled to or couples with (and the like) are intended to describe either an indirect or direct electrical connection. Thus, if a first device couples to a second device, that connection can be made through a direct electrical connection, or through an indirect electrical connection via other devices and/or connections.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, feature, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative. Additionally, although this disclosure describes or illustrates particular embodiments as providing particular advantages, particular embodiments may provide none, some, or all of these advantages.

What is claimed is:

1. A power delivery (PD) controller in a USB Type-C system, the PD controller comprising:
   a power-usage circuit having a power input;
   a first filter having a first filter input and a first filter output, wherein the first filter input is coupled to a configuration (CC) input;
   a second filter having a second filter input and a second filter output, wherein the second filter input is coupled to the first filter output;
   a first comparator having a first comparator output and first and second comparator inputs, wherein the first comparator input is coupled to the second filter output; and
   a transistor having a control terminal and a current terminal, wherein the control terminal is coupled to the first comparator output, and the current terminal is coupled to the power input.

2. The PD controller of claim 1, wherein the second comparator input is coupled to a reference voltage terminal providing a reference voltage.

3. The PD controller of claim 2, wherein the reference voltage is based upon a voltage at the first comparator input without a received transmission and a voltage at the first comparator input during a transmission.

4. The PD controller of claim 1, further comprising a second comparator having a second comparator output and third and fourth comparator inputs, wherein the third comparator input is coupled to the first filter output; and
   wherein the power-usage circuit further includes a data input coupled to the second comparator output.

5. The PD controller of claim 1, wherein the first filter includes a low-pass filter coupled between the CC input and the second filter.

6. The PD controller of claim 1, wherein the CC input is either a first CC input or a second CC input.

7. The PD controller of claim 1,
   wherein the CC input is configured to receive a PD message, and
   wherein the PD message complies with a USB PD specification.

8. The PD controller of claim 1, wherein the power-usage circuit includes at least one of:
   a microcontroller unit (MCU);
   a receiver;
   a transmitter;
   an I2C interface;
   an oscillator; or
   memory.

9. The PD controller of claim 1, wherein the first comparator is configured to:
   detect a preamble of a PD message received at the CC input; and
   turn on the transistor in response to detecting the preamble,
   wherein the power-usage circuit is configured to exit a low-power mode when the transistor is activated.

10. The PD controller of claim 9, wherein the first comparator is further configured to:
    detect a period of inactivity after turning on the transistor; and
    cause the power-usage circuit to return to the low-power mode in response to detecting the period of inactivity.

11. A power delivery (PD) controller in a USB Type-C system, the PD controller comprising:
    a power-usage circuit having a power input and a data input;
    a configuration channel (CC) input;
    a first filter having a first filter input and a first filter output, wherein the first filter input is coupled to the CC input;
    a second filter having a second filter input and a second filter output, wherein the second filter input is coupled to the first filter output; and
    a first comparator having first and second comparator inputs and a first comparator output, wherein the first comparator input is coupled to the second filter output, and the first comparator output is coupled to the power input of the power-usage circuit; and a second comparator having third and fourth comparator inputs and a second comparator output, wherein the third comparator input is coupled to the first filter output, and the second comparator output is coupled to the data input of the power-usage circuit.

12. The PD controller of claim 11,
wherein a voltage at the second comparator input is configured to be equal to a reference voltage, and
wherein the first comparator is configured to detect a preamble in response to a voltage at the first comparator input being less than or equal to the voltage at the second comparator input.

13. The PD controller of claim 11,
wherein the fourth comparator input is coupled to a reference voltage terminal providing a reference voltage; and
wherein the reference voltage has a value that is an average of a minimum voltage of the comparator without a received transmission and a maximum voltage of the comparator during a transmission.

14. The PD controller of claim 11,
wherein responsive to detecting a preamble of a PD message, the first comparator is configured to provide a wake-up signal to the power-usage circuit, and
wherein the power-usage circuit is configured to:
  operate in a low-power mode; and
  exit the low-power mode in response to receiving the wake-up signal.

15. The PD controller of claim 14, wherein the low-power mode is configured to reduce power used by the power-usage circuit.

16. The PD controller of claim 14,
wherein the CC input is configured to receive a PD message,
wherein a preamble of the PD message comprises 64 bits, and
wherein the power-usage circuit is configured to exit the low-power mode before receiving the preamble of the PD message.

17. The PD controller of claim 16, wherein the PD message complies with a USB Type-C PD specification.

18. The PD controller of claim 11, wherein the CC input is either a first CC input or a second CC input.

19. The PD Controller of claim 11, wherein the power-usage circuit includes at least one of:
a microcontroller unit (MCU);
a receiver;
a transmitter;
an I2C interface;
an oscillator; or
memory.

* * * * *